United States Patent [19]

Yoshida et al.

[11] 4,313,065
[45] Jan. 26, 1982

[54] SWITCHING CIRCUIT WITH MOS FIELD EFFECT TRANSISTOR

[75] Inventors: Tadao Yoshida; Tadao Suzuki, both of Tokyo, Japan

[73] Assignee: Sony Corporation, Tokyo, Japan

[21] Appl. No.: 104,666

[22] Filed: Dec. 17, 1979

[30] Foreign Application Priority Data

Dec. 21, 1978 [JP] Japan .................. 53-158217

[51] Int. Cl.³ .................. H03F 3/18; H03K 17/687
[52] U.S. Cl. .................. 307/585; 307/570; 330/264; 330/298
[58] Field of Search .......... 307/570, 575, 576, 577, 307/584, 585; 330/264, 269, 207 P, 298; 361/91

[56] References Cited

U.S. PATENT DOCUMENTS 4,021,748 5/1977 Yoshida et al. .................. 330/269
4,209,713 6/1980 Satou et al. .................. 357/254 X

OTHER PUBLICATIONS

Evans et al., "Higher Power Ratings Extend V-MOS FETs' Dominion", *Electronics,* pp. 105-112; 6/1978.

*Primary Examiner*—Larry N. Anagnos
*Assistant Examiner*—Harold Pratt

*Attorney, Agent, or Firm*—Hill, Van Santen, Steadman, Chiara & Simpson

[57] ABSTRACT

A switching circuit with MOS field effect transistors includes a DC voltage source having first and second terminals, first and second MOS field effect transistors each having gate, source, drain electrodes and a substrate, a circuit for connecting the source and drain electrodes of the first and second field MOS effect transistors in push-pull amplifying relation between the first and second terminals of the DC voltage source, a signal input circuit for supplying a signal to drive the gate electrodes of the first and second MOS field effect transistors, an output circuit including an inductor and a load connected in series between the connection point of the first and second MOS field effect transistors and a reference point so that charging and discharging currents of the inductor flow alternately through the source and drain electrodes of each of the first and second MOS field effect transistors when the respective MOS field effect transistors are in their conductive state, and resistors connected between the source electrodes and the substrates of the first and second MOS field effect transistors such that the discharging current of the inductor is prevented from flowing through the respective substrates of the first and second MOS field effect transistors.

8 Claims, 15 Drawing Figures

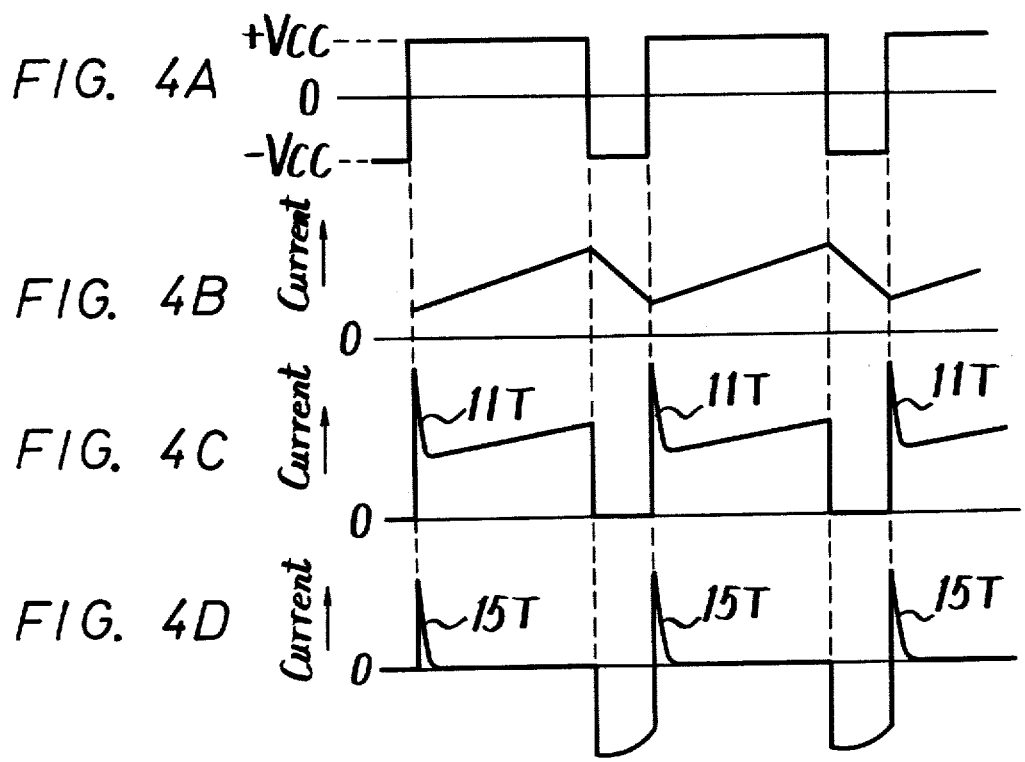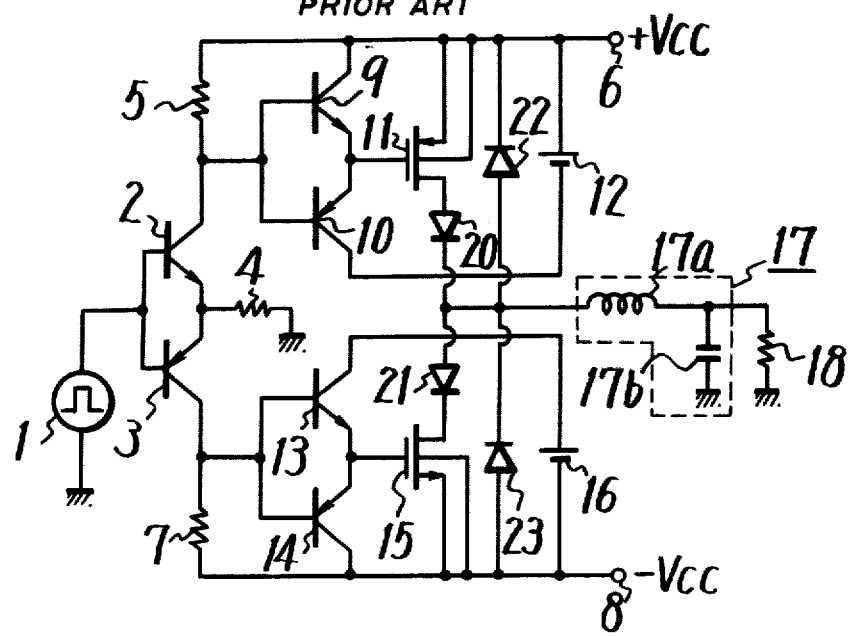

SWITCHING CIRCUIT WITH MOS FIELD EFFECT TRANSISTOR

BACKGROUND OF THE INVENTION

1. Field of the Invention

The present invention relates generally to a switching circuit using an MOS field effect transistor, and is directed more particularly to a switching circuit using a MOS field effect transistor in which the discharging current of an inductive load is prevented from being flowed between the substrate and drain electrode of the transistor.

2. Description of the Prior Art

In the art, such a switching circuit has been proposed as the output stage of a pulse width modulating amplifier in which a pair of complementary MOS field effect transistors (which will be hereinafter referred to as MOS-FETs) are connected in push-pull relation. In this case, since the MOS-FET is superior in switching characteristic, the frequency of a carrier for the pulse width modulating amplifier can be selected high, but on the contrary, the discharging current from an inductive load flows through the P-N diode connection between the substrate and drain electrode of the MOS-FET. In this case, since the switching speed of the diode is low, the inherent switching characteristic of the MOS-FET can not be utilized sufficiently.

Up to now, there has been proposed no such a switching circuit which uses a MOS-FET free from the above prior art defect and is effective as the output stage of a pulse width modulating (PWM) amplifier.

OBJECTS AND SUMMARY OF THE INVENTION

Accordingly, an object of the present invention is to provide a novel switching circuit with MOS-FETs removing the defect inherent to the prior art.

Another object of the invention is to provide a switching circuit with MOS-FETs which can reduce switching distortion with a simple construction.

In accordance with one example of the present invention, a switching circuit with MOS-FETs is provided which includes a DC voltage source having first and second terminals, first and second MOS-FETs each having gate, source, drain electrodes and a substrate, a circuit for connecting the source and drain electrodes of said first and second MOS-FETs in push-pull amplifying relation between the first and second terminals of the DC voltage source, a signal supplying circuit for supplying a signal to drive the gate electrodes of the first and second MOS-FETs, an output circuit including an inductance element and a load connected in series between the connection point of the first and second MOS-FETs and a reference point so that charging and discharging currents of the inductance element flow alternately through the source and drain electrodes of each of the first and second MOS-FETs when the respective MOS-FETs are in their conductive state, and a resistive element connected between the source electrode and the substrate of each of the first and second MOS-FETs such that the discharging current of the inductance element is prevented from flowing through the respective substrates of the first and second MOS-FETs.

The other objects, features and advantages of the present invention will be apparent from the following description taken in conjunction with the attached drawings through which the same references designate the same elements.

BRIEF DESCRIPTION OF THE DRAWINGS

FIGS. 4A through 4D are waveform diagrams used for explaining the operation of the prior art switching circuit shown in FIG. 1;

FIG. 6 is a circuit diagram showing another example of the prior art switching circuit with a MOS-FET;

DESCRIPTION OF THE PREFERRED EMBODIMENTS

Before describing the present invention, prior art MOS-FET switching circuit will be now explained with reference to the attached drawings.

Figure 1:
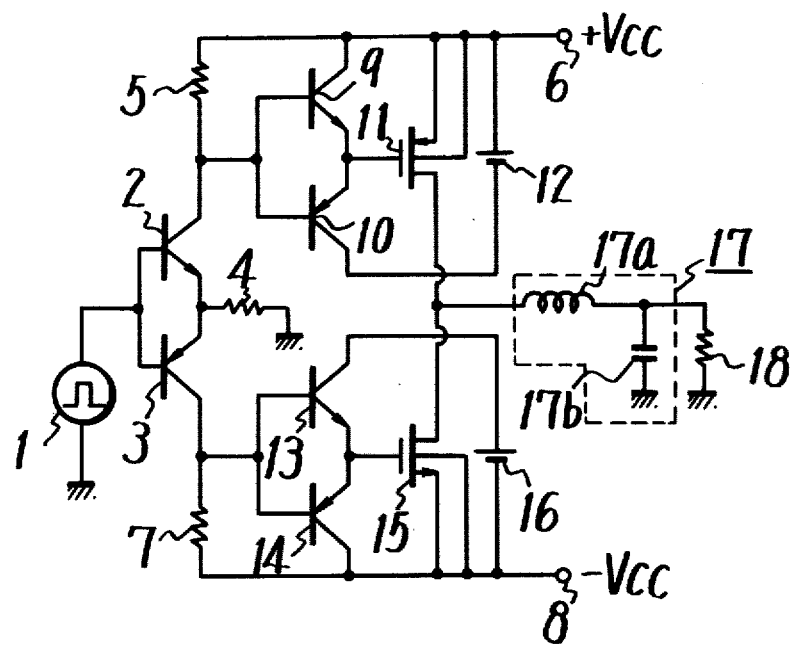
FIG. 1 is a circuit diagram showing an example of the prior art switching circuit with a MOS-FET.

FIG. 1 shows an example of the prior art MOS-FET switching circuit. In FIG. 1, 1 designated a signal source of a PWM (pulse width modulated) signal with the center frequency of, for example, 500 KH$_z$. The signal source 1 is grounded at its one end and connected at its other end to the connection point between the bases of an NPN transistor 2 and a PNP transistor 3. The emitters of the transistors 2 and 3 are connected together to the ground through a resistor 4. The collector of the transistor 2 is connected through a resistor 5 to a power supply terminal 6 to which a positive DC voltage $+V_{CC}$ is applied, while the collector of the transistor 3 is connected through a resistor 7 to a power supply terminal 8 to which a negative DC voltage $-V_{CC}$ equal to the positive DC voltage $+V_{CC}$ in absolute value is supplied. The collector of the transistor 2 is further connected to the connection point between the bases of an NPN transistor 9 and a PNP transistor 10 which form a buffer amplifier, and the connection point between the emitters of the transistors 9 and 10 is connected to the gate electrode of a P-channel type MOS-FET 11 which forms a switching element. The collector of the transistor 9 is connected to the power supply terminal 6, while the collector of the transistor 10 is connected to the negative electrode of a DC voltage source such as a battery 12 whose positive electrode is connected to the power supply terminal 6. The source electrode of the MOS-FET 11 is connected to the power supply terminal 6. The collector of the transistor 3 is further connected to the connection point between the bases of an NPN transistor 13 and a PNP transistor 14 which form a buffer amplifier, and the connection point between the emitters of the transistors 13 and 14 is connected to the gate electrode of an N-channel type MOS-FET 15 which forms a switching element. The collector of the transistor 13 is connected to the positive electrode of a DC voltage source such as a battery 16 whose negative electrode is connected to the collector of the transistor 14. The collector of the transistor 14 is also connected to the power supply terminal 8. The source electrode of the MOS-FET 15 is connected to the power supply terminal 8. The drain electrodes of the MOS-FETs 11 and 15 are connected together to the ground through a series connection of a low pass filter 17, which consists of an inductor such as a coil 17a and a capacitor 17b, and a resistor 18 such as a speaker and so on. In this case, the ground voltage is selected as an intermediate or average voltage between the DC voltage $+V_{CC}$ and $-V_{CC}$.

In the prior art MOS-FET switching circuit shown in FIG. 1, the MOS-FETs 11 and 15 are made ON and OFF alternately by the PWM signal from the signal source 1 and the output signal appearing at the connection point between the drain electrodes of the MOS-FETs 11 and 15 is supplied through the low pass filter 17 to the speaker 18 so that a sound is reproduced from the speaker 18.

In general, it is well known that since a MOS-FET has no minority carrier different from a bi-polar transistor, the MOS-FET is high in switching speed and hence suitable as a switching element for switching a high frequency higher than, for example, 500 KHz such as that of a PWM signal.

Figure 2:
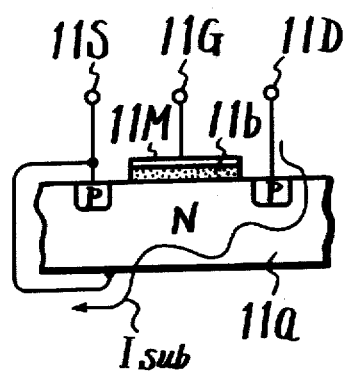
FIG. 2 is a schematic cross-sectional view of a MOS-FET showing the flow of its substrate current.
Figure 3:
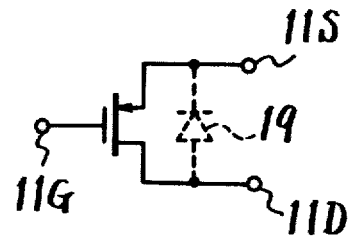
FIG. 3 is an equivalent circuit diagram of the MOS-FET showing the P-N junction between the substrate and drain electrode of the MOS-FET.

In the case of FIG. 1, when the respective MOS-FETs 11 and 15 are in the conductive state, the charging and discharging currents of the inductor 17a flow through the drain-source electrodes of the conducitve MOS-FETs 11 and 15 in the reverse directions. However, for example, in the P-channel type MOS-FET 11, in order to improve the various characteristic thereof, its semiconductor substrate 11a and source electrode 11S are electrically connected as shown in FIG. 2. Therefore, when the discharging current owing to the charge discharging of the inductor 17a i.e. current $I_{sub}$ in the illustrated example flows from the drain electrode 11D through the substrate 11a to the source electrode 11S of the MOS-FET 11, a parasitic diode 19 is formed in the substrate 11a between the source electrode 11S and the drain electrode 11D as shown in FIG. 3 by the broken lines. Due to the formation of the parasitic diode 19, the recovery time of the MOS-FET 11 becomes large, for example, 0.5 μsec. to 1 μsec. In FIG. 2, 11b designates an insulating layer formed on the upper surface of the substrate 11a, 11G a gate electrode, and 11M a metal layer formed on the insulating layer 11b, respectively.

Figure 5:
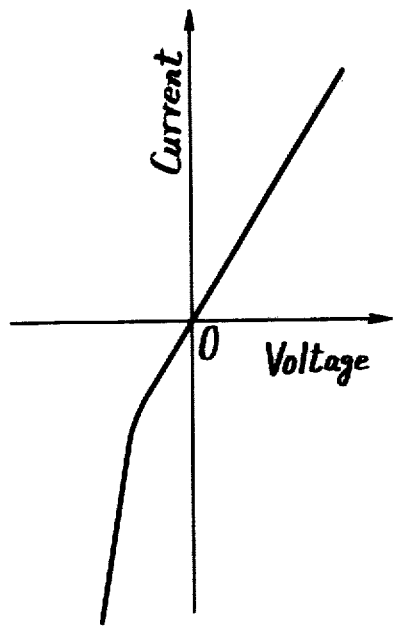
FIG. 5 is a graph showing the current versus voltage characteristic of the prior art circuit shown in FIG. 1.

Therefore, when a PWM signal such as shown in FIG. 4A is supplied from the signal source 1 to the gate electrodes of the MOS-FETs 11 and 15 in the example FIG. 1, a current shown in FIG. 4B flows through the inductor 17a. In this case, transient currents 11T and 15T, which are very large and caused by the magnitude of the recovery time of the diodes formed in the MOS-FETs 11 and 15, shown in FIGS. 4C and 4D, flow through the MOS-FETs 11 and 15, respectively. Thus, power loss is caused in the prior art switching circuit shown in FIG. 1 by the transient currents 11T and 15T and hence there may occur such a fear that the MOS-FETs 11 and 15 are damaged by the heat generated by the large transient currents 11T and 15T. Further, due to the fact that the discharging current flows through the parasitic diodes 19 of the MOS-FETs 11 and 15, their static characteristics or voltage versus current characteristics on their conductive state become non-linear in the discharging current direction (negative current direction) as shown in the graph of FIG. 5 and distortion is generated in the output signal.

In order to improve or remove the power loss caused in the prior art switching circuit of FIG. 1, there has been proposed another prior art MOS-FET switching circuit which is shown in FIG. 6 in which the reference numerals same as those in FIG. 1 designate the same elements whose explanation will be omitted for the sake of brevity.

In the prior art switching circuit shown in FIG. 6, the drain electrode of the MOS-FET 11 is connected to the anode of a diode 20, the cathode thereof is in turn connected to the anode of a diode 21, and the cathode thereof is connected to the drain electrode of the MOS-FET 15. The connection point between the diodes 20 and 21 is grounded through the series connection of the low pass filter 17 and the resistor 18 as the load. In this case, the diodes 20 and 21 serve to prevent the discharging current from flowing through the substrates of the MOS-FETs 11 and 15. The connection point of the diodes 20 and 21 is further connected to the anode of a diode 22, whose cathode is connected to the power supply terminal 6, and to the cathode of a diode 23 whose anode is connected to the power supply terminal 8. In this case, the discharging current, which may intend to flow through the MOS-FETs 11 and 15, flows through the diodes 22 and 23.

With the prior art switching circuit shown in FIG. 6, since the reverse currents, which may intend to flow through the MOS-FETs 11 and 15, are flowed through the diodes 22 and 23, the recovery time of the MOS-FETs 11 and 15 is not affected, and any transient current does not or hardly flows through the MOS-FETs 11 and 15 because the switching time of the diodes 22 and 23 is relatively short. Therefore, the switching loss can be improved.

Figure 7:
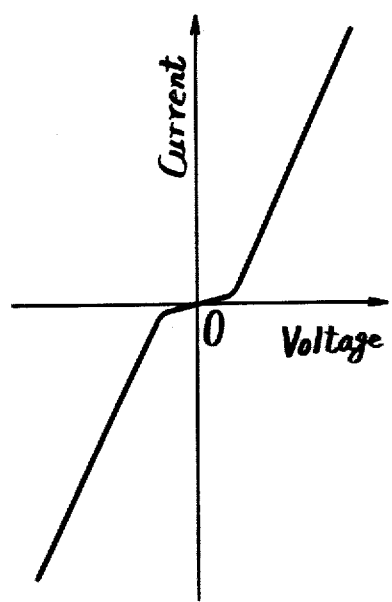
FIG. 7 is a graph showing the current versus voltage characteristic of the prior art switching circuit shown in FIG. 6.

In the prior art switching circuit of FIG. 6, since the diodes 20 and 22 are provided for the MOS-FET 11 and the diodes 21 and 23 are provided for the MOS-FET 15, respectively, the static characteristics or voltage versus current characteristics of the MOS-FETs 11 and 15 at their conductive state include a step (non-linear) near zero point as shown in the graph of FIG. 7 due to the influence of these diodes and there occurs such a fear that distortion may be generated in the output signal by the step. Further, since the prior art switching circuit of FIG. 6 uses the diodes of high speed switching, it becomes expensive.

An example of the MOS-FET switching circuit according to the present invention, which can reduce the switching loss and also output signal distortion, will be hereinafter described with reference to FIGS. 8 to 12.

Figure 8:
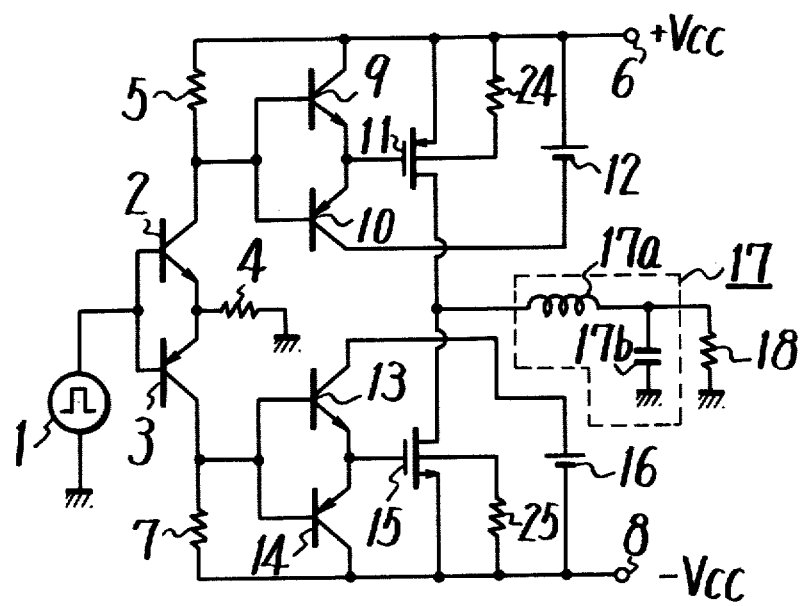
FIG. 8 is a circuit diagram showing an example of the switching circuit with a MOS-FET according to the present invention.

FIG. 8 is a connection diagram showing an example of the MOS-FET switching circuit according to the invention in which the reference numerals corresponding to those of FIG. 1 designate the same elements and their explanation will be omitted for the sake of brevity.

Figure 9:
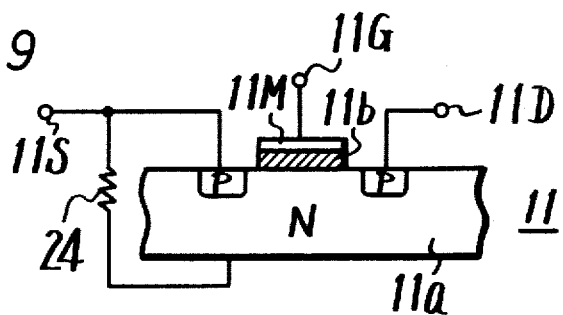
FIGS. 9 and 12 are respectively cross-sectional views of MOS FETs used in the invention shown in FIG. 8.

In this example of the invention, between the substrates and source electrodes of the MOS-FETs 11 and 15, there are connected resistors 24 and 25, respectively, which serve to prevent the discharging current of the inductor 17a of the low pass filter 17 from flowing through the MOS-FETs 11 and 15. In this case, the resistance values of the resistors 24 and 25 are selected greater than the channel resistance values of the MOS-FETs 11 and 15 when they are in ON state. In this case, the resistor 24 is connected to the MOS-FET 11 in the manner as shown in FIG. 9. Although the connection manner of the resistor 25 to the MOS-FET 15 is not shown, it may be substantially same as that shown in FIG. 9.

With the MOS-FET switching circuit according to the invention shown in FIG. 8, the discharging current from the inductor 17a due to its charge discharging is blocked by the resistors 24 and 25, so that the recovery time of the MOS-FETs 11 and 15 are hardly affected as different from the prior art MOS-FET circuit shown in FIG. 1, no transient current flows through the MOS-FETs 11 and 15 and hence the switching loss can be improved or reduced.

Further, in the example of the invention shown in FIG. 8, no diodes are used as different from the prior art MOS-FET switching circuit shown in FIG. 6, so that the linearity of the static characteristics of the MOS-FETs 11 and 15 upon their ON-state can be improved and hence the distortion in the output signal can be reduced.

Figure 10:
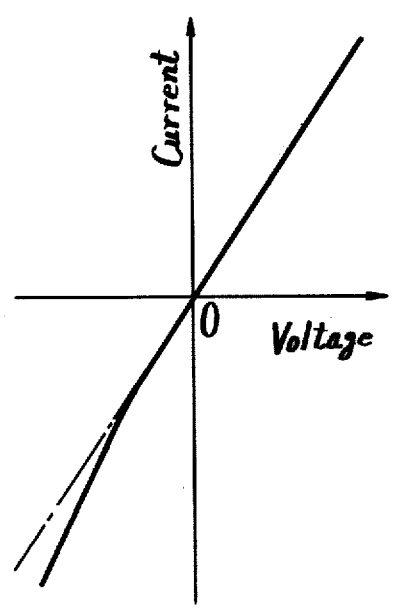
FIGS. 10 and 11 are respectively graphs showing the current versus voltage characteristics of the switching circuit of the invention shown in FIG. 8.

By the way, when the resistance values of the respective resistors 24 and 25 used in the circuit of the invention shown in FIG. 8 are selected as 10Ω which is more than the channel resistances (ON resistance), for example, 6Ω of the MOS-FETs 11, 15 upon their ON-state by 1.6 or more times, the static characteristics of the respective MOS-FETs 11 and 15 upon their ON-state become as shown in the graph of FIG. 10 which shows that the static characteristics of the MOS-FETs 11 and 15 used in this invention are improved as compared with those of the MOS-FETs 11 and 15 used in the circuits of FIGS. 1 and 6 which are shown in the graphs of FIGS. 5 and 7, respectively.

Figure 11:
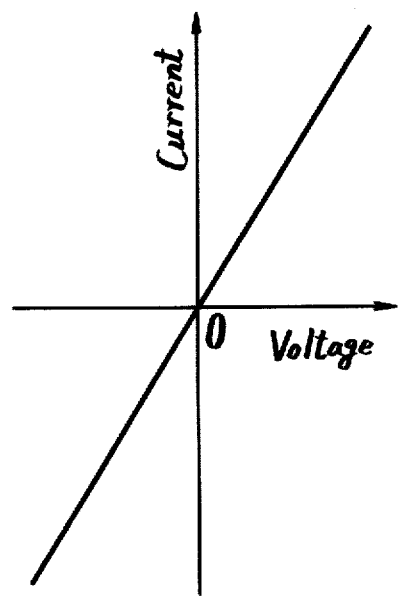

Further, when the resistance values of the resistors 24 and 25 are selected as 60Ω which is ten times as the channel resistances of the MOS-FETs 11 and 15 when they are in ON-state, the linearity of the static characteristics of the MOS-FETs 11 and 15 upon their ON-state become much superior as shown in the graph of FIG. 11 and hence the distortion of the output signal is improved. The other operation of the circuit of the invention shown in FIG. 8 is substantially same as that of the prior art circuit shown in FIG. 1.

As described above, according to the MOS-FET switching circuit of the present invention, the switching loss can be reduced and the output signal distortion can be also reduced.

Figure 12:
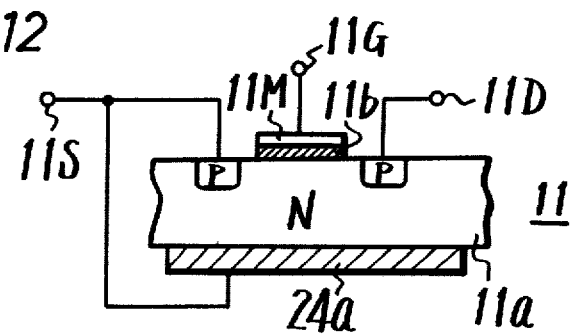

In the above example of the invention, the resistors 24 and 25 are respectively inserted between the substrates and the source electrodes of the MOS-FETs 11 and 15. However, it is also possible that, instead of the resistor 24, as resistive layer 24a is formed on the lower surface of the substrate 11a and the drain 11S of the MOS-FET 11 is connected through the resistive layer 24a to the substrate 11a as shown in FIG. 12, which is substantially same for the MOS-FET 15.

In the above example of the invention, the MOS-FETs are formed of the grounded source circuit configuration, but it may be possible that the MOS-FETs are formed of the grounded drain circuit configuration.

It will be apparent that many modifications and variations could be effected by one skilled in the art without departing from the spirits or scope of the novel concepts of the present invention so that the spirits or scope of the invention should be determined by the appended claims only.

We claim as our invention:

1. A switching circuit comprising:
    a DC voltage source having first and second terminals; first and second MOS field effect transistors each having gate, source, drain electrodes and a substrate;
    circuit means for connecting the source and drain electrodes of said first and second field effect transistors in push-pull amplifying relation between the first and second terminals of said DC voltage source;
    signal supplying means for supplying a signal to drive said gate electrodes of said first and second field effect transistors;
    output circuit means including inductance means and a load connected in series between the connection point of said first and second field effect transistors and a reference point so that charging and discharging currents of said inductance means flow alternately through said source and drain electrodes of each of said first and second field effect transistors when the respective field effect transistors are in its conductive state; and
    resistive means connected between the source electrode and the substrate of each of said first and second field effect transistors such that the discharging current of said inductance means is prevented from flowing through the respective substrates of said first and second field effect transistors.

2. A switching circuit according to claim 1, in which said first and second field effect transistors are complementary field effect transistors.

3. A switching circuit according to claim 1, in which each of said first and second field effect transistors is connected in grounded source circuit configuration.

4. A switching circuit according to claim 3, in which said resistive means comprises:
    (a) a first resistor connected between the source electrode and substrate of said first field effect transistor; and
    (b) a second resistor connected between the source electrode and substrate of said second field effect transistor.

5. A switching circuit according to claim 4, in which each resistance value of said first and second resistor is selected substantially equal to or greater than 1.6 times the ON resistance of first and second field effect transistors.

6. A switching circuit according to claim 3, in which said resistive means comprises:
    (a) a first resistive layer formed on the substrate of said first field effect transistor and electrically connected to the source electrode thereof; and
    (b) a second resistive layer formed on the substrate of said second field effect transistor and electrically connected to the source electrode thereof.

7. A switching circuit according to claim 6, in which each resistance value of said first and second resistive layers is selected substantially equal to or greater than 1.6 times the ON resistance of said respective first and second field effect transistors.

8. A switching circuit according to claim 3, in which said signal supplying means supplies a pulse width modulated signal to the gate electrodes of said first and second field effect transistors.

* * * * *